United States Patent
Li

(10) Patent No.: US 10,254,314 B1
(45) Date of Patent: Apr. 9, 2019

(54) CURRENT SENSING CIRCUIT AND INTEGRATED CIRCUIT FOR FOUR-SWITCH BUCK-BOOST CONVERTOR

(71) Applicant: Chengdu Monolithic Power Systems Co., Ltd., Chengdu (CN)

(72) Inventor: Lei Li, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 0 days.

(21) Appl. No.: 16/103,807

(22) Filed: Aug. 14, 2018

(51) Int. Cl.
  *H02M 1/00* (2006.01)
  *G01R 19/00* (2006.01)
  *H02M 3/158* (2006.01)
  *G01R 15/00* (2006.01)
  *H02M 1/08* (2006.01)

(52) U.S. Cl.
  CPC ........... *G01R 19/003* (2013.01); *G01R 15/00* (2013.01); *H02M 1/08* (2013.01); *H02M 3/1582* (2013.01); *H02M 2001/0009* (2013.01)

(58) Field of Classification Search
  CPC .............................. H02M 3/158; H02M 3/1582
  See application file for complete search history.

(56) References Cited

U.S. PATENT DOCUMENTS

| | | | |
|---|---|---|---|
| 9,184,651 B2 | 11/2015 | Nguyen et al. | |
| 9,812,963 B1 | 11/2017 | Nguyen et al. | |
| 9,817,039 B2 | 11/2017 | Xu et al. | |
| 9,882,482 B1 | 1/2018 | Hendry | |
| 2015/0381039 A1* | 12/2015 | Hari | H02M 1/15 323/271 |

* cited by examiner

*Primary Examiner* — Adolf Berhane
*Assistant Examiner* — Afework Demisse
(74) *Attorney, Agent, or Firm* — Perkins Coie LLP

(57) ABSTRACT

A current sensing circuit used in a buck-boost converter having a pair of buck switches and a pair of boost switches, including: a first sensing circuit providing a detection current though a first normally-ON transistor and a second normally-ON transistor, and a second sensing circuit detecting an average of the detection current and providing a current sensing signal in accordance with the average. During a turn ON time of a first low side switch of the pair of buck switches, the detection current represents a current flowing through the first low side switch, the current sensing signal represents an output current. During a turn ON time of the second low side switch of the pair of boost switches, the detection current represents a current flowing through the second low side switch, and the current sensing signal represents an input current.

19 Claims, 8 Drawing Sheets

CURRENT SENSING CIRCUIT AND INTEGRATED CIRCUIT FOR FOUR-SWITCH BUCK-BOOST CONVERTOR

CROSS-REFERENCE TO RELATED APPLICATIONS

This application claims the benefit of CN application 201710730990.8, filed on Aug. 23, 2018, and incorporated herein by reference.

TECHNICAL FIELD

The present invention relates generally to electrical circuits, and more particularly but not exclusively to current sensing circuits.

BACKGROUND

Portable electronic devices are becoming smaller and smaller, which accordingly causes the volume and capacity of their batteries to decrease. In order to improve endurance of the batteries, power supply modules of these electronic devices are required to provide a stable output voltage when the battery voltage varies in a wide range. Four-switch buck-boost converters thus are widely used in these applications.

A four-switch buck-boost converter typically requires the input current, the output current and/or the inductor current to be sensed in some way to control the power switches and/or to protect the converter. Conventionally, the inductor current is sensed by placing a sensing resistor in series with the inductor, the voltage across the sensing resistor is detected using a sensing amplifier to produce a signal proportional to the inductor current. This type of current sensing approach has the drawback of adding power dissipated in the sensing resistor thereby reducing the overall efficiency of the buck-boost converter.

Alternatively, it is known to use one of the power switches as a sensing resistor and detect the voltage drop across the internal resistance between drain and source of the MOS device (RDSON). This alternative approach overcomes the efficiency reduction caused by a sensing resistor. Nevertheless, since the four power switches in the buck-boost converter are controlled and driven for three different working modes including a buck mode, a boost mode and a buck-boost mode, the current flowing though one of the power switches is simply a part of the inductor current, so multiple current sensing circuits are required to respectively detect the current flowing though each power switch. However, each of multiple current sense circuits is dependent on the different circuit configurations, which increases the cost and size of the system application, and also increases the complexity of a control circuit and the current sense circuits.

Accordingly, a simpler current sensing circuit used for a four-switch buck-boost converter is required to at least address one or some of the above deficiencies.

SUMMARY

Embodiments of the present invention are directed to a current sensing circuit for a buck-boost converter, wherein the buck-boost converter comprises a first high side switch and a first low side switch which are couple in series between an input voltage and a ground and a second high side switch and a second low side switch which are coupled in series between an output voltage and the ground, the current sensing circuit comprises a first normally-ON transistor, a second normally-ON transistor, a first sensing circuit and a second sensing circuit. The first normally-ON transistor has a first terminal and a second terminal, wherein during a turn ON time of the first low side switch, the first terminal is coupled to the ground, and during a turn ON time of the second low side switch, the first terminal is coupled to a second switch node that is connected to a terminal of the second high side switch and a terminal of the second low side switch. The second normally-ON transistor has a first terminal and a second terminal, wherein during the turn ON time of the first low side switch, the first terminal is coupled to a first switch node that is connected to a terminal of the first high side switch and a terminal of the first low side switch, and during the turn ON time of the second low side switch, the first terminal is coupled to the ground. The first sensing circuit having a first input terminal coupled to the second terminal of the first normally-ON transistor, a second input terminal coupled to the second terminal of the second normally-ON transistor and an output terminal configured to provide detection current. The second sensing circuit detects an average value of the detection current and provides a current sensing signal in accordance with the average value of the detection current, wherein during the turn ON time of the first low side switch, the detection current represents a current flowing though the first low side switch, the current sensing signal represents an output current of the buck-boost converter, and during the turn ON time of the second low side switch, the detection current represents a current flowing though the second low side switch, the current sensing signal represents an input current of the buck-boost converter.

BRIEF DESCRIPTION OF THE DRAWING

Non-limiting and non-exhaustive embodiments are described with reference to the following drawings. The drawings are only for illustration purpose. These drawings are not necessarily drawn to scale. The relative sizes of elements illustrated by the drawings may differ from the relative size depicted.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
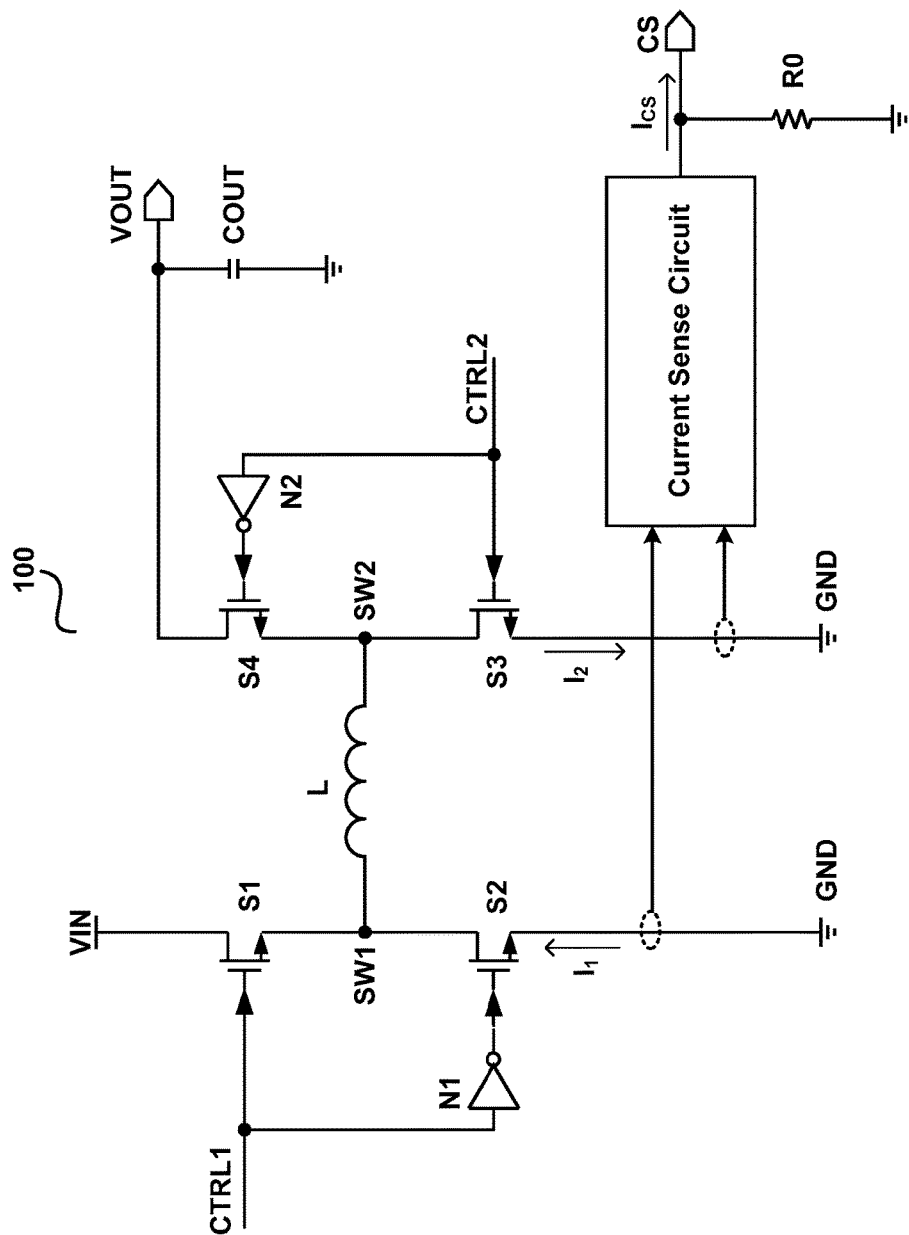
FIG. 1 shows a schematic diagram of a four-switch buck-boost converter 100 in accordance with an embodiment of the present invention.

FIG. 1 shows a schematic diagram of a four-switch buck-boost converter 100 in accordance with an embodiment of the present invention. In the embodiment of FIG. 1, the buck-boost converter 100 is configured to convert an input voltage VIN to an output voltage VOUT, and comprises a pair of buck switches, a pair of boost switches, an inductor L, an output capacitor COUT, and a current sensing circuit. Wherein the pair of buck switches has a first high side switch S1 and a first low side switch S2 which are coupled in series between the input voltage VIN and a ground. The pair of boost switches has a second high side switch S4 and a second low side switch S3 which are coupled in series between the output voltage VOUT and the ground. The pair of buck switches has a first switch node SW1 that is connected to a terminal of the first high side switch S1 and a terminal of the first low side switch S2, the pair of boost switches has a second switch node SW2 that is connected to a terminal of the second high side switch S4 and a terminal of the second low side switch S3. The switches in the buck-boost converter 100 may be any controllable semiconductor devices, such as MOSFET (metal oxide semiconductor field effect transistor), IGBT (isolated gate bipolar transistor) and so on.

As shown in FIG. 1, the first high side switch S1 has a drain terminal, a source terminal and a gate terminal, wherein the drain terminal is coupled to the input voltage VIN, the source terminal is coupled to the first switch node SW1, and the gate terminal is configured to receive a buck control signal CTRL1 generated by a driving circuit. The first low side switch S2 has a drain terminal, a source terminal and a gate terminal, wherein the drain terminal is coupled to the first switch node SW1, the source terminal is coupled to the ground, and the gate terminal is configured to receive the buck control signal CTRL1 through an inverter N1. The second low side switch S3 has a drain terminal, a source terminal and a gate terminal, wherein the drain terminal is coupled to the second switch node SW2, the source terminal is coupled to the ground, and the gate terminal is configured to receive a boost control signal CTRL2 generated by the driving circuit. The second high side switch S4 has a drain terminal, a source terminal and a gate terminal, wherein the drain terminal is coupled to the output voltage VOUT, the source terminal is coupled to the second switch node SW2, and the gate terminal is configured to receive the boost control signal CTRL2 through an inverter N2. The inductor L has a first terminal coupled to the first switch node SW1 and a second terminal coupled to the second switch node SW2. The output capacitor COUT has a first terminal coupled to the output voltage VOUT and a second terminal coupled to the ground.

Conventionally, the buck-boost converter 100 has two operational modes including a buck mode and a boost mode. In the buck mode, the second high side switch S4 is turned ON, the second low side switch S3 is turned OFF, the first high side switch S1 and the first low side switch S2 are turned ON and OFF alternatively by the buck control signal CTRL1 so as to convert the input voltage VIN to the output voltage VOUT. During a turn ON time of the first low side switch S2, a current I1 is flowing from the ground to the first switch node SW1 through the first low side switch S2. In the boost mode, the first high side switch S1 is turned ON, the first low side switch S2 is turned OFF, the second high side switch S4 and the second low side switch S3 are turned ON and OFF alternatively by the boost control signal CTRL2 so as to convert the input voltage VIN to the output voltage VOUT. During a turn ON time of the second low side switch S3, a current I2 is flowing from the second switch node SW2 to the ground through the second low side switch S3. In one embodiment, the method of controlling the pair of buck switches or the pair of boost switches may apply PWM (Pulse Width Modulation). In another embodiment, the method of controlling the pair of buck switches may apply COT (Constant ON-Time), the method of controlling the pair of boost switches may apply COFT (Constant OFF-Time).

In the embodiment of FIG. 1, in the buck mode, during the turn ON time of the first low side switch S2, the current sensing circuit is configured to detect the current I1 flowing through the first low side switch S2 and to provide a current sensing signal ICS representing an output current of the buck-boost converter 100. In the boost mode, during the turn ON time of the second low side switch S3, the current sensing circuit is configured to detect the current I2 flowing through the second low side switch S3 and to provide the current sensing signal ICS that represents an input current of the buck-boost converter 100. The current sensing signal ICS may be a detection voltage signal which is proportional to the current flowing through a resistor R0, the detection voltage signal represents the output current in the buck mode and represents the input current in the boost mode, respectively.

Figure 2:
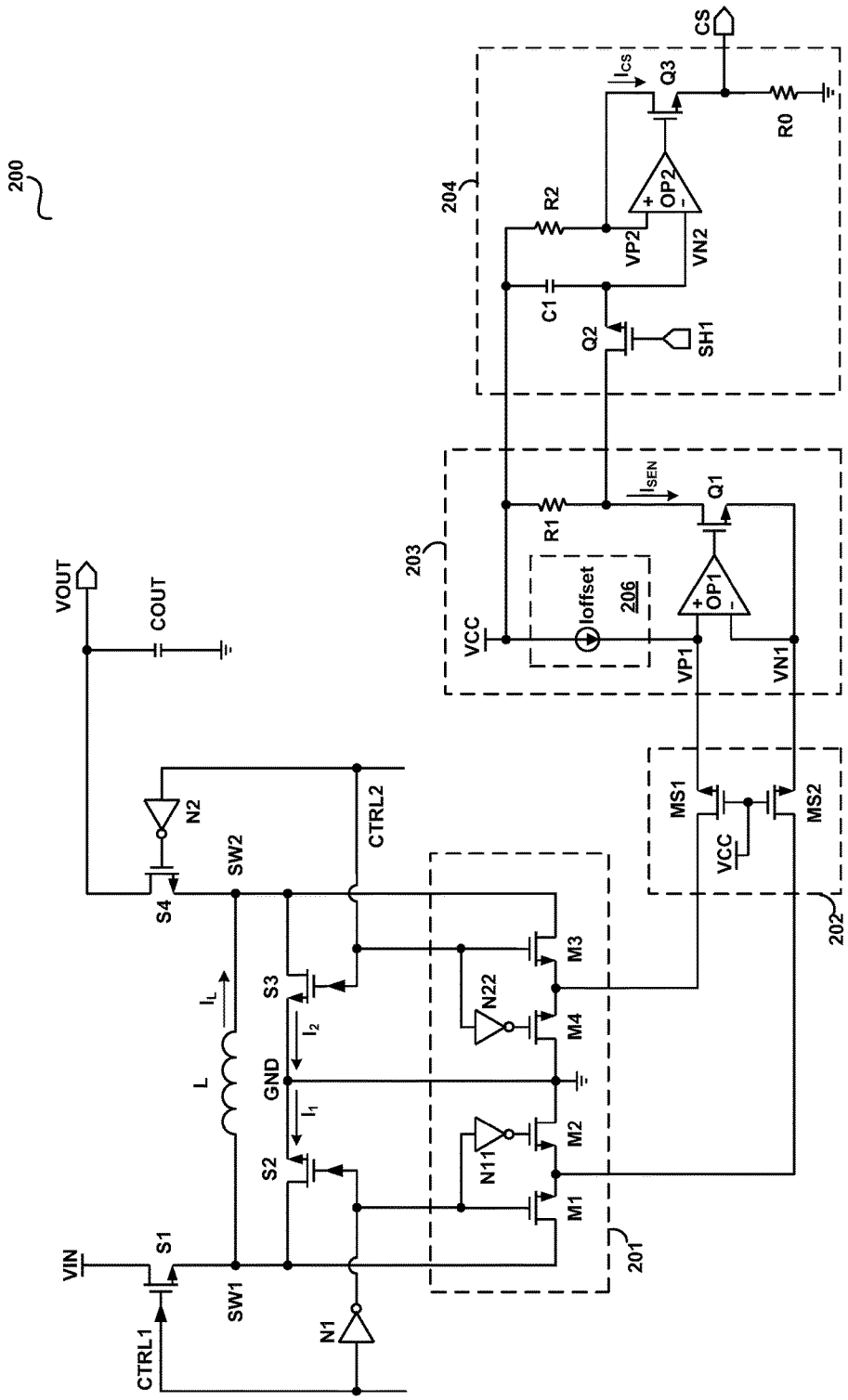
FIG. 2 shows a circuit diagram of a four-switch buck-boost converter 200 in accordance with an embodiment of the present invention.

FIG. 2 shows a circuit diagram of a four-switch buck-boost converter 200 in accordance with an embodiment of the present invention. In the embodiment of FIG. 2, when the buck-boost converter 200 works in the buck mode, the current sensing circuit is configured to detect the current I1 flowing through the first low side switch S2 during the turn ON time of the first low side switch S2 and provides the current sensing signal ICS that represents the output current. When the buck-boost converter 200 works in the boost mode, the current sensing circuit is configured to detect the current I2 flowing through the second low side switch S3 during the turn ON time of the second low side switch S3 and provides the current sensing signal ICS that represents the input current.

In the embodiment of FIG. 2, the current sensing circuit comprises a pair of sensing transistors 202 having a first normally-ON transistor MS1 and a second normally-ON transistor MS2, a first sensing circuit 203 and a second sensing circuit 204. In one embodiment, the first and second normally-ON transistors MS1 and MS2 are driven by a supply voltage VCC to keep continuous conduction. In another embodiment, the continuous conduction of the first and second normally-ON transistors MS1 and MS2 may be controlled by other voltage instead of the supply voltage VCC. The first and second normally-ON transistors MS1 and MS2 are matching and of a same type of transistor. Either of the first low side switch S2 and the second low side switch S3 has a larger size of the same type of transistor of the first and second normally-ON transistors MS1 and MS2.

The first normally-ON transistor MS1 has a first terminal and a second terminal, wherein during the turn ON time of the first low side switch S2, the first terminal is coupled to the ground, and during the turn ON time of the second low side switch S3, the first terminal is coupled to the second switch node SW2. The second normally-ON transistor MS2 has a first terminal and a second terminal, wherein during the turn ON time of the first low side switch S2, the first terminal is coupled to a first switch node SW1, and during the turn ON time of the second low side switch S3, the first terminal is coupled to the ground.

In the embodiment of FIG. 2, the current sensing circuit further comprises a switch array 201. The switch array 201 comprises a first switch M1, a second switch M2, a third switch M3 and a fourth switch M4, each of which has a source terminal, a drain terminal and a gate terminal. And wherein the drain terminal of the first switch M1 is coupled to the first switch node SW1, the source terminal of the first switch M1 is coupled to the first terminal of the second normally-ON transistor MS2, the gate terminal of the first switch M1 is coupled to the buck control signal CTRL1. The drain terminal of the second switch M2 is coupled to the ground, the source terminal of the second switch M2 is coupled to the first terminal of the second normally-ON transistor MS2, the gate terminal of the second switch M2 is coupled to the buck control signal CTRL2 through an inverter N11. The drain terminal of the third switch M3 is coupled to the second switch node SW2, the source terminal of the third switch M3 is coupled to the first terminal of the first normally-ON transistor MS1, the gate terminal is coupled to the boost control signal CTRL2. The drain terminal of the fourth switch M4 is coupled to the ground, the source terminal of the fourth switch M4 is coupled to the first terminal of the first normally-ON transistor MS1, the gate terminal is coupled to the boost control signal CTRL2 through an inverter N22. In a first state of the switch array 201, the first low side switch S2 is turned ON, the first switch M1 and the fourth switch M4 are turned ON, the second switch M2 and the third switch M3 are turned OFF. In a second state of the switch array 201, the second low side switch S3 is turned ON, the first switch S1 and the fourth switch S4 are turned OFF, the second switch M2 and the third switch M3 are turned ON. In a third state of the switch array 201, the first and second low side switches S2 and S3 are turned OFF, the first and third switches M1 and M3 are turned OFF, the second and fourth switches M2 and M4 are turned ON.

The first sensing circuit 203 has a first input terminal, a second input terminal and an output terminal, wherein the first input terminal is coupled to the second terminal of the first normally-ON transistor MS1, the second input terminal is coupled to the second terminal of the second normally-ON transistor MS2, the output terminal is configured to provide the detection current ISEN that represents a current flowing through one of the first and second low side switches S2 and S3 currently conducting. More specifically, the first sensing circuit 203 may not only, in the first state of the switch array 201, provides the detection current ISEN that represents the current I1 flowing though the first low side switch S2 during the turn ON time of the first low side switch S2, but also, in the second state of the switch array 201, provides the detection current ISEN that represents the current I2 flowing though the second low side switch S3 during the turn ON time of the second low side switch S3.

In the embodiment of FIG. 2, the first sensing circuit 203 comprises a first operational amplifier OP1, a transistor Q1 and a resistor R1. The first operational amplifier OP1 has a non-inversing terminal coupled to the second terminal of the first normally-ON transistor MS1, an inversing terminal coupled to the second terminal of the second normally-ON transistor MS2, and an output terminal. The transistor Q1 comprises an N type DMOS (Double Diffused Metal Oxide Semiconductor) transistor. The transistor Q1 has a drain terminal coupled to a first terminal of the resistor R1, a source terminal coupled to the inverting terminal of the first operational amplifier OP1, and a gate terminal coupled to the output terminal of the first operation amplifier OP1. A second terminal of the resistor R1 is coupled to the supply voltage VCC.

Assuming the voltage at the non-inverting input terminal of the first operational amplifier OP1 is VP1, and the voltage at the inverting input terminal of the first operational amplifier OP1 is VN1. When the first low side switch S2 is turned ON, as can be deviated from the circuit in FIG. 2, VP1=VSW1+I1*RdsON1, and VN1=VSW1+ISEN*RdsONs2. Because the voltages at two input terminals of the first operational amplifier OP1 are equal, i.e., VP1=VN1, as a result, ISEN=I1*(RdsON1/RdsONs2). Wherein RdsON1 is the ON resistance of the first low side switch S2 and RdsONs2 is the ON resistance of the second normally-ON transistor MS2. Similarly, when the second low side switch S3 is turned ON, as can be deviated from the circuit in FIG. 2, VP1=I2*RdsON2, and VN1=ISEN*RdsONs2. Because VP1=VN1, ISEN=I2*(RdsON2/RdsONs2), wherein RdsON2 is the ON resistance of the second low side switch S3. So during the turn ON time of the first low side switch S2, the detection current ISEN is directly proportional to the current I1 flowing through the first low side switch S2, with a proportionality RdsON1/RdsONs2. In other words, the detection current ISEN can represent the current I1 flowing through the first low side switch S2 during the turn ON time of the first low side switch S2. During the turn ON time of the second low side switch S3, the detection current ISEN is directly proportional to the current I2 flowing through the second low side switch S2, with a proportionality RdsON2/RdsONs2. In other words, the detection current ISEN can represent the current I2 flowing through the second low side switch S3 during the turn ON time of the second low side switch S3. The detection current ISEN flows through the transistor Q1 and the resistor R1, a detection voltage across the resistor R1 is generated and can represent the current I1 flowing through the first low side switch S2 or the current I2 flowing through the second low side switch S3.

The second sensing circuit 204 comprises a transistor Q2, a capacitor C1, a resistor R2, a second operational amplifier OP2, a transistor Q3 and a resistor R0. The second sensing circuit 204 is configured to sample an average of the detection current ISEN through the transistor Q2 and holds the average of the detection current ISEN as charge stored in the capacitor C1.

Those of skill in the art will appreciate that the detection current ISEN can represent the current I1 flowing through the first low side switch S2 or the current I2 flowing through the second low side switch S3, and thus the average of the detection current ISEN also can represent the average of the current I1 or the average of the current I2. The average of the current I1 is detected by sampling the current I1 at the midpoint of the turn ON time of the first low side switch S2. The average of the current I2 is detected by sampling the current I2 at the midpoint of the turn ON time of the second low side switch S3.

The transistor Q2 has a drain terminal, a source terminal and a gate terminal, wherein the drain terminal is coupled to a first terminal of the resistor R1, a gate terminal is coupled to a control signal SH1. The second operational amplifier OP2 has a non-inverting terminal, an inverting terminal and an output terminal, wherein the non-inverting terminal is coupled to the supply voltage VCC and a first terminal of the capacitor C1 through a resistor R2, the inverting terminal is coupled to the source terminal of the transistor Q2 and a second terminal of the capacitor C1. The transistor Q3 has a drain terminal, a source terminal and a gate terminal, wherein the drain terminal is coupled to the non-inverting terminal of the second operational amplifier OP2, the source terminal is coupled to the ground through the resistor R0, the gate terminal is coupled to the output terminal of the operational amplifier OP2. In one embodiment, the resistance of the resistors R1 and R2 is equal or matching.

In the embodiment of FIG. 2, when the control signal SH1 coupled to the gate terminal of the transistor Q2 is logic high, the transistor Q2 is turned ON, the second sensing circuit 204 detects an average of the detection current ISEN. When the control signal SH1 is logic low, the transistor Q2 is turned OFF, the second sensing circuit 204 holds the average of the detection current ISEN as charge stored in the capacitor C1. The control signal SH1 may be generated by a controller (not shown) or another circuit without detracting from the merits of the present invention.

More specifically, when the buck-boost converter 200 works in the buck mode and the first low side switch S2 is turned ON, the average of the detection current ISEN is detected and held as the charge stored in the capacitor C1 at the midpoint of the turn ON time of the first low side switch S2, the charge stored in the capacitor C1 is configured to generate the current sensing signal ICS that represents the output current. And when the buck-boost converter 200 works in the boost mode and the second low side switch S3 is turned ON, the average of the detection current ISEN is detected and held as the charge stored in the capacitor C1 at the midpoint of the turn ON time of the second low side switch S3, the charge stored in the capacitor C1 is configured to generate the current sensing signal ICS that represents the input current.

In the embodiment of FIG. 2, the current sensing circuit further comprises a bias current source 206. The bias current source 206 has a first terminal coupled to the supply voltage VCC and a second terminal coupled to the first input terminal of the first sensing circuit 203, to provide a bias current IOFFSET. Those of skill in the art will appreciate that, in other embodiments, the bias current source 206 may be coupled to one or more of the first input terminal and the second input terminal of the first sensing circuit 203, to provide the bias current IOFFSET.

In one embodiment, the resistor R2 with variable resistance is configured to trim the integrated circuit after its manufacture to improve mismatch and temperature excursion.

Figure 3:
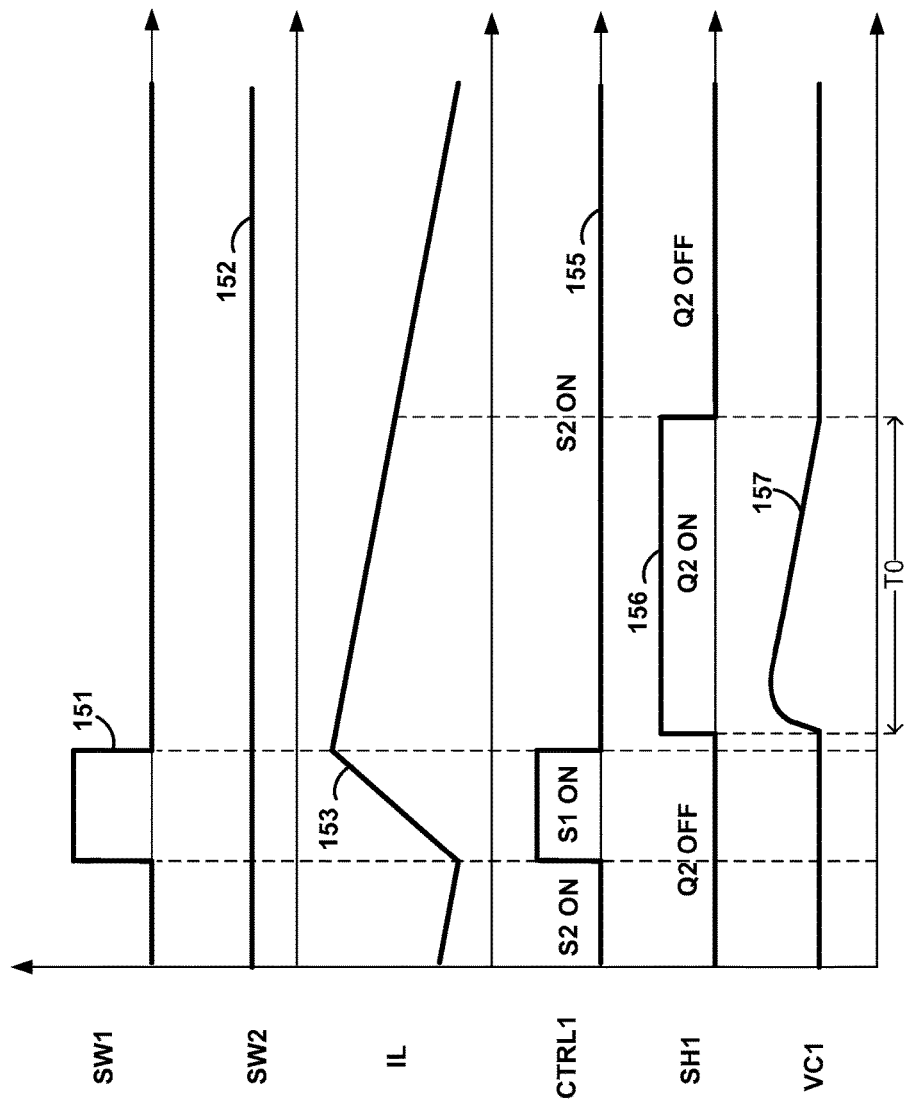
FIG. 3 shows a waveform diagram of signals of the buck-boost converter 200 in FIG. 2 working in a buck mode in accordance with an embodiment of the present invention.

FIG. 3 shows a waveform diagram of signals of the buck-boost converter 200 in FIG. 2 working in a buck mode in accordance with an embodiment of the present invention. FIG. 3 shows the switch signal at the first switch node SW1 (plot 151), the switch signal at the second switch node SW2 (plot 152), the inductor current IL (plot 153), the buck control signal CTRL1 for the pair of buck switches (plot 155), the gate signal SH1 driving the transistor Q2 (plot 156), and the voltage VC1 on the capacitor C1 (plot 157).

Referring to FIGS. 2 and 3, when the buck-boost converter 200 works in the buck mode, the second high side switch S4 is turned ON, the second low side switch S3 is turned OFF, the fourth switch M4 is turned ON, the third switch M3 is turned OFF. The first high side switch S1 and the first low side switch S2 are turned ON and OFF alternatively by the buck control signal CTRL1. When the buck control signal CTRL1 is logic low, the first low side switch S2 and the first switch M1 are turned ON, the second switch M2 is turned OFF, the first input terminal of the first sensing circuit 203 is coupled to the ground through the first normally-ON transistor MS1, the second input terminal of the first sensing circuit 203 is coupled to the first switch node SW1 through the second normally-ON transistor MS2. The first operational amplifier OP1 of the first sensing circuit 203 is configured to detect the current I1 flowing through the first low side switch S2 and to drive the transistor Q1 to generate the detection current ISEN that represents the current I1, the detection current ISEN flows through the resistor R1 to generate a detection voltage signal that can represent the current I1. At the start of the period T0, the control signal SH1 transits in logic high, the transistor Q2 is turned ON, the detection voltage signal on the resistor R2 starts to charge the capacitor C1 to sample to the value of the detection current ISEN. Upon the end of the period T0, i.e. at the midpoint of the turn ON time of the first low side switch S2, the transistor Q2 is turned OFF and the average of the detection current ISEN is stored as the charge in the capacitor C1. The input terminals of the second operational amplifier OP2 in the second sensing circuit 204 are coupled across the capacitor C1, and the second operational amplifier OP2 is configured to generate the current sensing signal ICS that represents the average of the detection current ISEN in accordance with the charge stored in the capacitor C1.

In the example of FIG. 3, the buck-boost converter 200 works in a buck mode, the output current IOUT and the current sensing signal ICS satisfy an equation that: IOUT=ICS, the input current IIN and the current sensing signal ICS satisfy an equation that: IIN=ICS*D1, wherein the D1 is the duty cycle of the buck control signal CTRL1.

Figure 4:
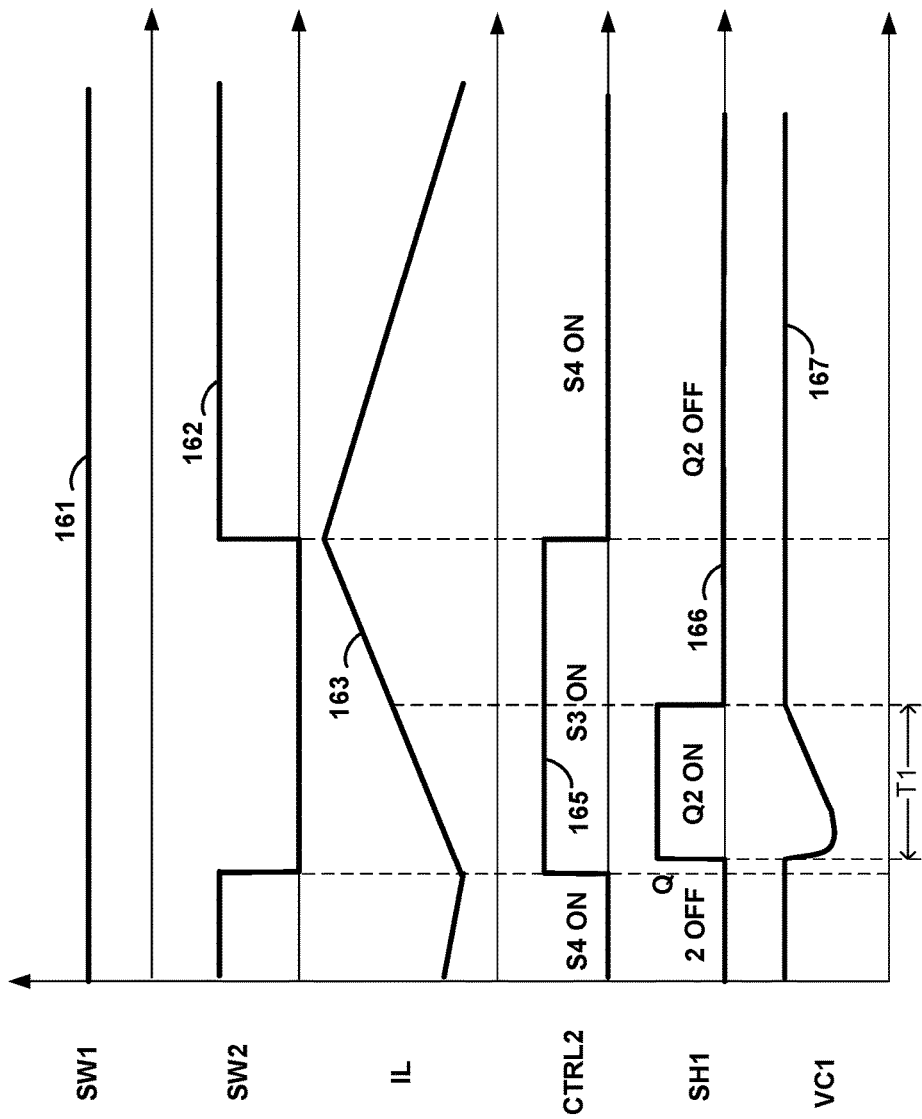
FIG. 4 shows a waveform diagram of signals of the buck-boost converter 200 in FIG. 2 working in a boost mode in accordance with an embodiment of the present invention.

FIG. 4 shows a waveform diagram of signals of the buck-boost converter 200 in FIG. 2 working in a boost mode in accordance with an embodiment of the present invention. FIG. 4 shows the switch signal at the first switch node SW1 (plot 161), the switch signal at the second switch node SW2 (plot 162), the inductor current IL (plot 163), the boost control signal CTRL2 for the pair of boost switches (plot 165), the gate signal SH1 driving the transistor Q2 (plot 166), and the voltage VC1 on the capacitor C1 (plot 167).

Referring to FIGS. 2 and 4, when the buck-boost converter 200 works in the boost mode, the first high side switch S1 is turned ON, the first low side switch S2 is turned OFF, the second switch M2 is turned ON, the first switch M1 is turned OFF. The second high side switch S4 and the second low side switch S3 are turned ON and OFF alternatively by the boost control signal CTRL2. When the boost control signal CTRL2 is logic high, the second low side switch S3 and the third switch M3 are turned ON, the fourth switch M4 is turned OFF, the first input terminal of the first sensing circuit 203 is coupled to the second switch node SW2 through the first normally-ON transistor MS1, the second input terminal of the first sensing circuit 203 is coupled to the ground through the second normally-ON transistor MS2. The first operational amplifier OP1 of the first sensing circuit 203 is configured to detect the current I2 flowing through the second low side switch S3 and to drive the transistor Q1 to generate the detection current ISEN that represents the current I2, the detection current ISEN flows through the resistor R1 to generate the detection voltage signal that can represent the current I2.

At the start of the period T1, the control signal SH1 transits in logic high, the transistor Q2 is turned ON, the detection voltage signal on the resistor R1 starts to charge the capacitor C1 to sample to the value of the detection current ISEN. Upon the end of the period T1, i.e. at the midpoint of the turn ON time of the second low side switch S3, the transistor Q2 is turned OFF and the average of the detection current ISEN is held as the charge stored in the capacitor C1. The input terminals of the second operational amplifier OP2 in the second sensing circuit 204 are coupled across the capacitor C1, and the second operational amplifier OP2 is configured to generate the current sensing signal ICS that represents the average of the detection current ISEN in accordance with the charge stored in the capacitor C1. In the example of FIG. 4, the buck-boost converter 200 works in a boost mode, the input current IIN and the current sensing signal ICS satisfy an equation that: IIN=ICS, the output current IOUT and the current sensing signal ICS satisfy an equation that: IOUT=ICS*(1−D2), wherein the D2 is the duty cycle of the boost control signal CTRL2.

Figure 5:
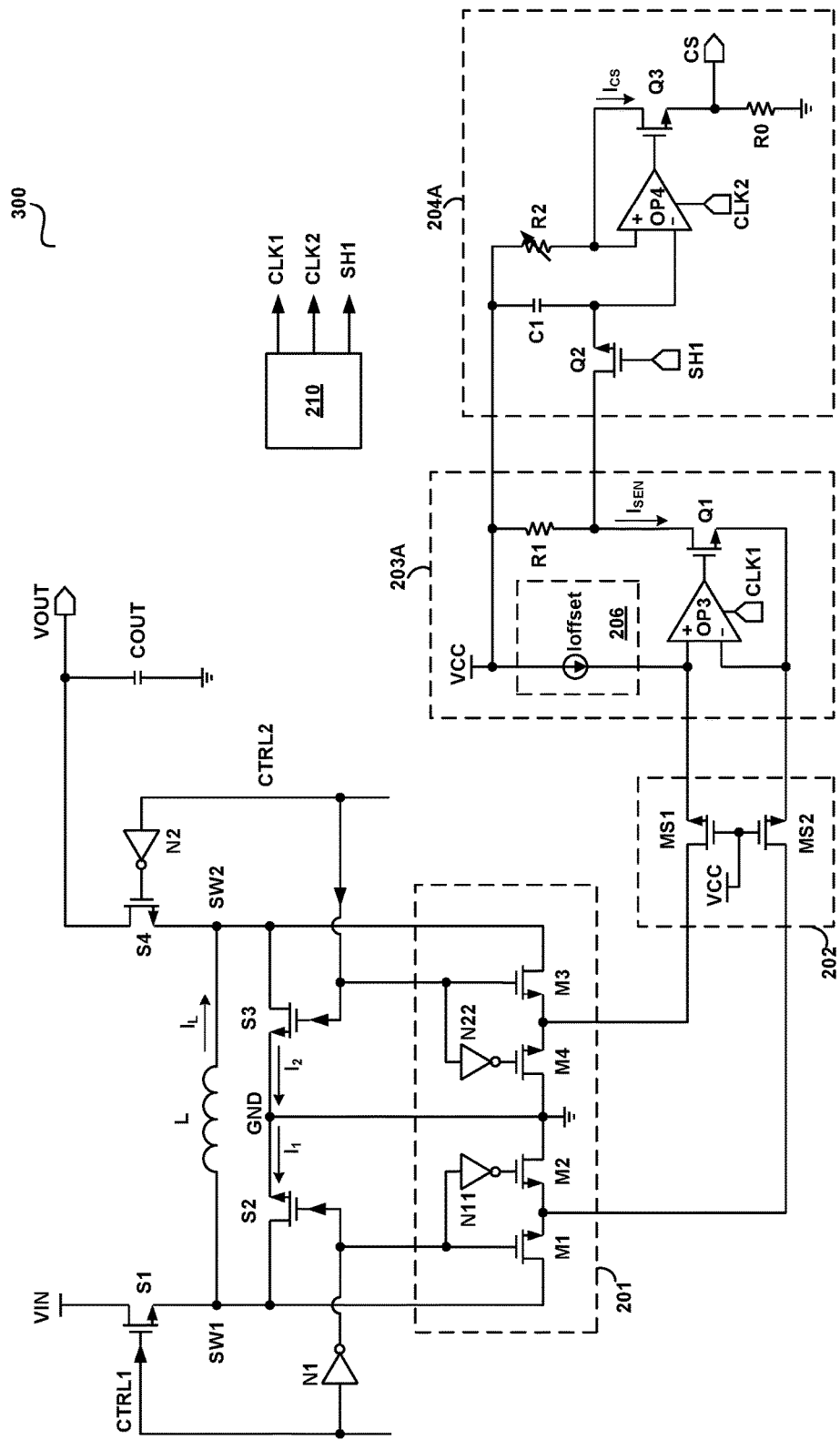
FIG. 5 shows a circuit diagram of a four-switch buck-boost converter 300 in accordance with an embodiment of the present invention.

FIG. 5 shows a circuit diagram of a four-switch buck-boost converter 300 in accordance with an embodiment of the present invention. The circuit of the buck-boost converter 300 in FIG. 5 is different from that of the buck-boost converter 200 shown in FIG. 2. A major difference is that a first sensing circuit 203A comprises a first auto-zero amplifier OP3 instead of the first operational amplifier OP1, a second sensing circuit 204A comprises a second auto-zero amplifier OP4 instead of the second operational amplifier OP2.

In the embodiment of FIG. 5, the first sensing circuit 203A comprises the first auto-zero amplifier OP3, the transistor Q1 and the resistor R1. The first auto-zero amplifier OP3 has a non-inverting terminal, an inverting terminal, a clock input terminal and an output terminal, wherein the non-inverting terminal is coupled to the second terminal of the second normally-ON transistor MS2, the inverting terminal is coupled to the second terminal of the first normally-ON transistor MS1, the clock input terminal is coupled to the first clock signal CLK1. The transistor Q1 has a drain terminal, a source terminal and a gate terminal, wherein the drain terminal is coupled to the first terminal of the resistor R1, the source terminal is coupled to the inverting terminal of the first auto-zero amplifier OP3, the gate terminal is coupled to the output terminal of the first auto-zero amplifier OP3. A second terminal of the resistor R1 is coupled to the supply voltage VCC.

The second sensing circuit 204A comprises a transistor Q2, a capacitor C1, a resistor R2, a second auto-zero amplifier OP4, a transistor Q3 and a resistor R0. The transistor Q2 has a drain terminal, a source terminal and a gate terminal, wherein the drain terminal is coupled to the first terminal of the resistor R1, the gate terminal is coupled to the control signal SH1. The second auto-zero amplifier OP2 has a non-inverting terminal, an inverting terminal, a clock input terminal and an output terminal, wherein the non-inverting terminal is coupled to the supply voltage VCC through the resistor R2 and is coupled to a first terminal of the capacitor C1, the inverting terminal is coupled to the source terminal of the transistor Q2 and a second terminal of the capacitor C1, the clock input terminal is coupled to the second clock signal CLK2. In one embodiment, the second clock signal CLK2 is complementary with the first clock signal CLK1. The transistor Q3 has a drain terminal, a source terminal and a gate terminal, wherein the drain terminal is coupled to the non-inverting terminal of the second auto-zero amplifier OP4, the source terminal is coupled to the ground through the resistor R0, the gate terminal is coupled to the output terminal of the second auto-zero amplifier OP4. In one embodiment, the resistance of the resistors R1 and R2 is matching. In one embodiment, the resistor R2 with variable resistance is configured to trim the integrated circuit after its manufacture to improve mismatch and temperature excursion.

An auto-zero amplifier has two working modes including an outputting mode and a zeroing mode. In the outputting mode of the auto-zero amplifier, an error signal is stored in a holding circuit, subsequently, in the zeroing mode of the auto-zero amplifier, the error signal previously stored is added to a main amplifier unit of the auto-zero amplifier to cancel out the offset. Traditionally, the auto-zero amplifier is configured to operate in one of the outputting mode and the zeroing mode, and this switching is accomplished by applying a clock signal generated by a timer to the internal analog switch elements of the auto-zero amplifier. In one embodiment, the first clock signal CLK1 and the second clock signal CLK2 are complementary and have duty cycles of 0.5. In the embodiment of FIG. 5, when the first clock signal CLK1 is logic high, the second clock signal CLK2 is logic low, the first auto-zero amplifier OP3 is at the outputting mode, the second auto-zero amplifier OP3 is at the zeroing mode. When the first clock signal CLK1 is logic low, the second clock signal CLK2 is logic high, the second auto-zero amplifier OP4 is at the outputting mode, the first auto-zero amplifier OP3 is at the zeroing mode. The first clock signal CLK1 and the second clock signal CLK2 are related to the frequency of the buck control signal CTRL1 or the boost control signal CTRL2. Accordingly, the first clock signal CLK1 and the second clock signal CLK2 may be generated by a controller (not shown) or another circuit (e.g. 210) without detracting from the merits of the present invention. Several of the details of the embodiments described below with reference to FIGS. 6-8.

Figure 6:
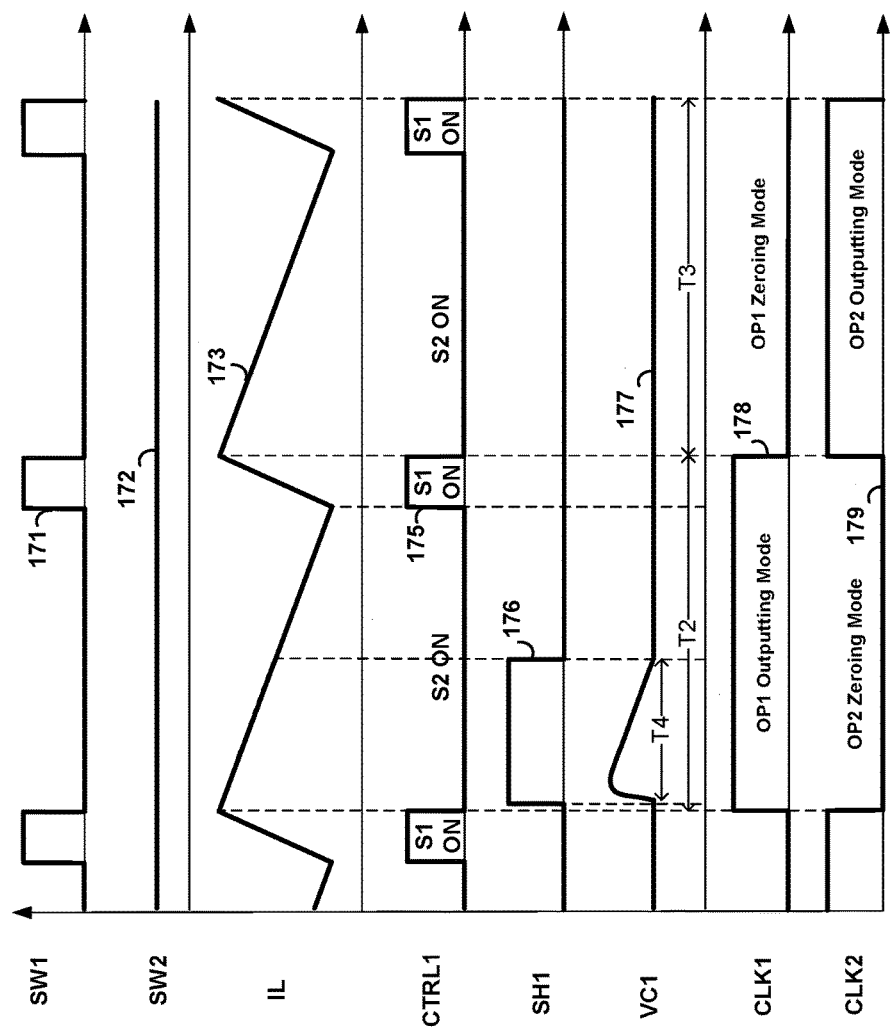
FIG. 6 shows a waveform diagram of signals of the buck-boost converter 300 in FIG. 5 working in a buck mode in accordance with an embodiment of the present invention.

FIG. 6 shows a waveform diagram of signals of the buck-boost converter 300 in FIG. 5 working in a buck mode in accordance with an embodiment of the present invention. FIG. 6 shows the switch signal at the first switch node SW1 (plot 171), the switch signal at the second switch node SW2 (plot 172), the inductor current IL (plot 173), the buck control signal CTRL1 for the pair of buck switches (plot 175), the gate signal SH1 driving the transistor Q2 (plot 176), and the voltage VC1 on the capacitor C1 (plot 177), the first clock signal CLK1 for the first auto-zero amplifier OP3 (plot 178) and the second clock signal CLK2 for the second auto-zero amplifier OP4 (plot 179).

Referring to FIGS. 5 and 6, when the buck-boost converter 300 works in the buck mode, the second high side switch S4 is turned ON, the second low side switch S3 is turned OFF, the fourth switch M4 is turned ON, the third switch M3 is turned OFF. The first high side switch S1 and the first low side switch S2 are turned ON and OFF alternatively by the buck control signal CTRL1.

During the period of T2, the first clock signal CLK is logic high, and the second clock signal CLK2 is logic low, the first auto-zero amplifier OP3 is at the outputting mode, the second auto-zero amplifier OP4 is at the zeroing mode. In the embodiment of FIG. 6, the frequency of the buck control signal CTRL1 is twice as much as that of the first clock signal CLK1 or the second clock signal CLK2. In other embodiment, the frequency of the buck control signal CTRL1 is 2*N times as much as that of the first clock signal CLK1 or the second clock signal CLK2, wherein N is an integer higher than 1.

During the period of T4, the control signal SH1 is logic high and the buck control signal CTRL1 is logic low, the first low side switch S2 and the first switch M1 are turned ON, the second switch M2 is turned OFF, the first auto-zero amplifier OP3 at the outputting mode is configured to detect the current I1 flowing through the first low side switch S2 and to generate the detection current ISEN that represents the current I1. During the period of T4, the transistor Q2 is turned ON, the detection voltage signal on the resistor R1 starts to charge the capacitor C1 to sample the value of the detection current ISEN. Upon the end of the period T4, i.e. at the midpoint of the turn ON time of the first low side switch S2, the transistor Q2 is turned OFF and the average of the detection current ISEN is held as the charge stored in the capacitor C1. During the period of T3, the second auto-zero amplifier OP4 at the zeroing mode is configured to generate the detection current ICS in accordance with the charge stored in the capacitor C1.

In the example of FIG. 6, the buck-boost converter 300 works in a buck mode, the output current IOUT and the current sensing signal ICS satisfy an equation that: IOUT=ICS, the input current IIN and the current sensing signal ICS satisfy an equation that: IIN=ICS*D1, wherein the D1 is the duty cycle of the buck control signal CTRL1.

Figure 7:
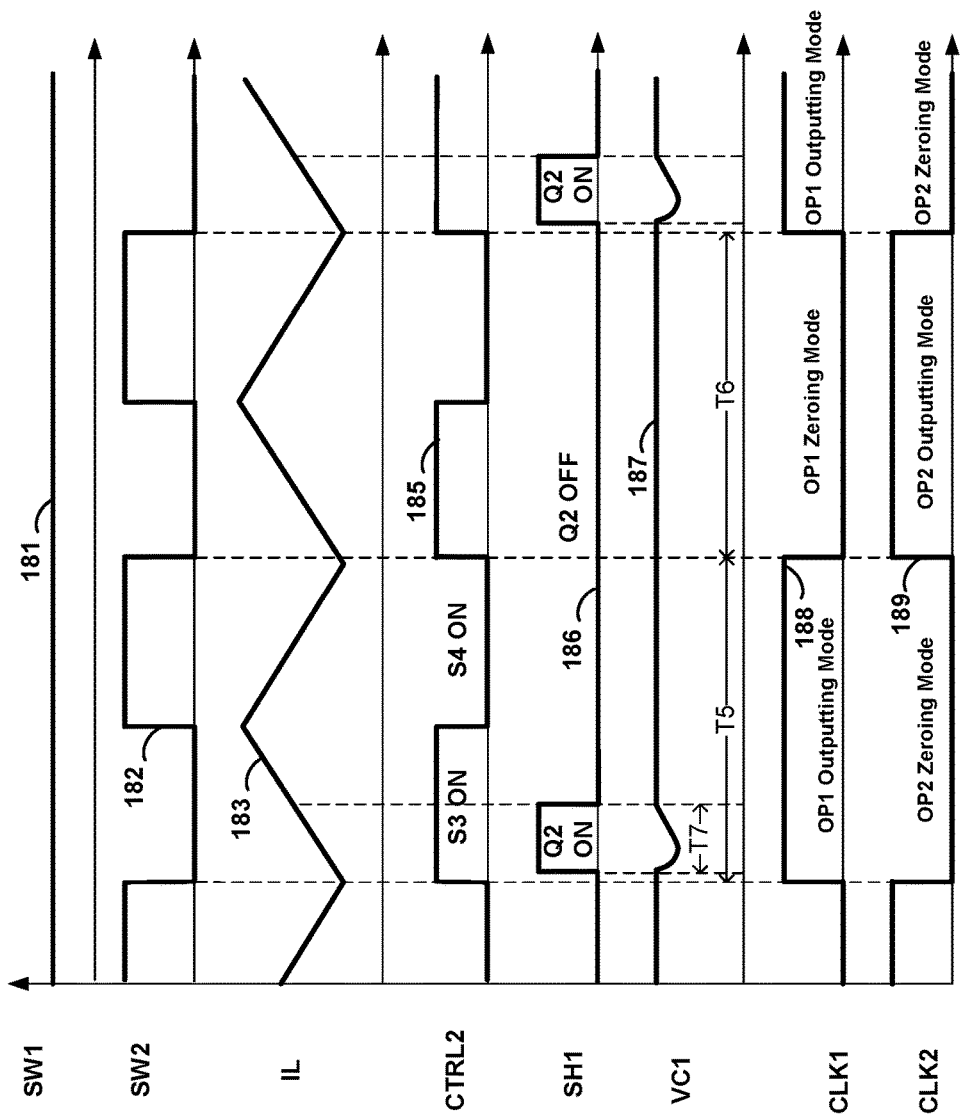
FIG. 7 shows a waveform diagram of signals of the buck-boost converter 300 in FIG. 5 working in a boost mode in accordance with an embodiment of the present invention.

FIG. 7 shows a waveform diagram of signals of the buck-boost converter 300 in FIG. 5 working in a boost mode in accordance with an embodiment of the present invention. FIG. 7 shows the switch signal at the first switch node SW1 (plot 181), the switch signal at the second switch node SW2 (plot 182), the inductor current IL (plot 183), the boost control signal CTRL2 for the pair of boost switches (plot 185), the gate signal SH1 driving the transistor Q2 (plot 186), and the voltage VC1 on the capacitor C1 (plot 187), the first clock signal CLK1 for the first auto-zero amplifier OP3 (plot 188) and the second clock signal CLK2 for the second auto-zero amplifier OP4 (plot 189).

Referring to FIGS. 5 and 7, when the buck-boost converter 300 works in the boost mode, the first high side switch S1 is turned ON, the first low side switch S2 is turned OFF, the second switch M2 is turned ON, the first switch M1 is turned OFF. The second high side switch S4 and the second low side switch S3 are turned ON and OFF alternatively by the boost control signal CTRL2.

During the period of T5, the first clock signal CLK is logic high, and the second clock signal CLK2 is logic low, the first auto-zero amplifier OP3 is at the outputting mode, the second auto-zero amplifier OP4 is at the zeroing mode. During the period of T6, the first clock signal CLK is logic low, and the second clock signal CLK2 is logic high, the first auto-zero amplifier OP3 is at the zeroing mode, the second auto-zero amplifier OP4 is at the outputting mode. In the embodiment of FIG. 7, the frequency of the boost control signal CTRL2 is twice as much as that of the first clock signal CLK1 or the second clock signal CLK2.

During the period of T7, the control signal SH1 is logic high and the boost control signal CTRL2 is logic high, the second low side switch S3 and the third switch M3 are turned ON, the fourth switch M4 is turned OFF, the first auto-zero amplifier OP3 at the outputting mode is configured to detect the current I2 flowing through the second low side switch S3 and to generate the detection current ISEN that represents the current I2. During the period of T7, the transistor Q2 is turned ON, the detection voltage signal on the resistor R1 starts to charge the capacitor C1 to sample the value of the detection current ISEN. Upon the end of the period T7, i.e. at the midpoint of the turn ON time of the second low side switch S3, the transistor Q2 is turned OFF and the average of the detection current ISEN is held as the charge stored in the capacitor C1. During the period of T8, the second auto-zero amplifier OP4 at the outputting mode is configured to generate the detection current ICS in accordance with the charge stored in the capacitor C1.

In the example of FIG. 7, the buck-boost converter 300 works in a boost mode, the input current IIN and the current sensing signal ICS satisfy an equation that: IIN=ICS, the output current IOUT and the current sensing signal ICS satisfy an equation that: IOUT=ICS(1−D2), wherein the D2 is the duty cycle of the boost control signal CTRL2.

Figure 8:
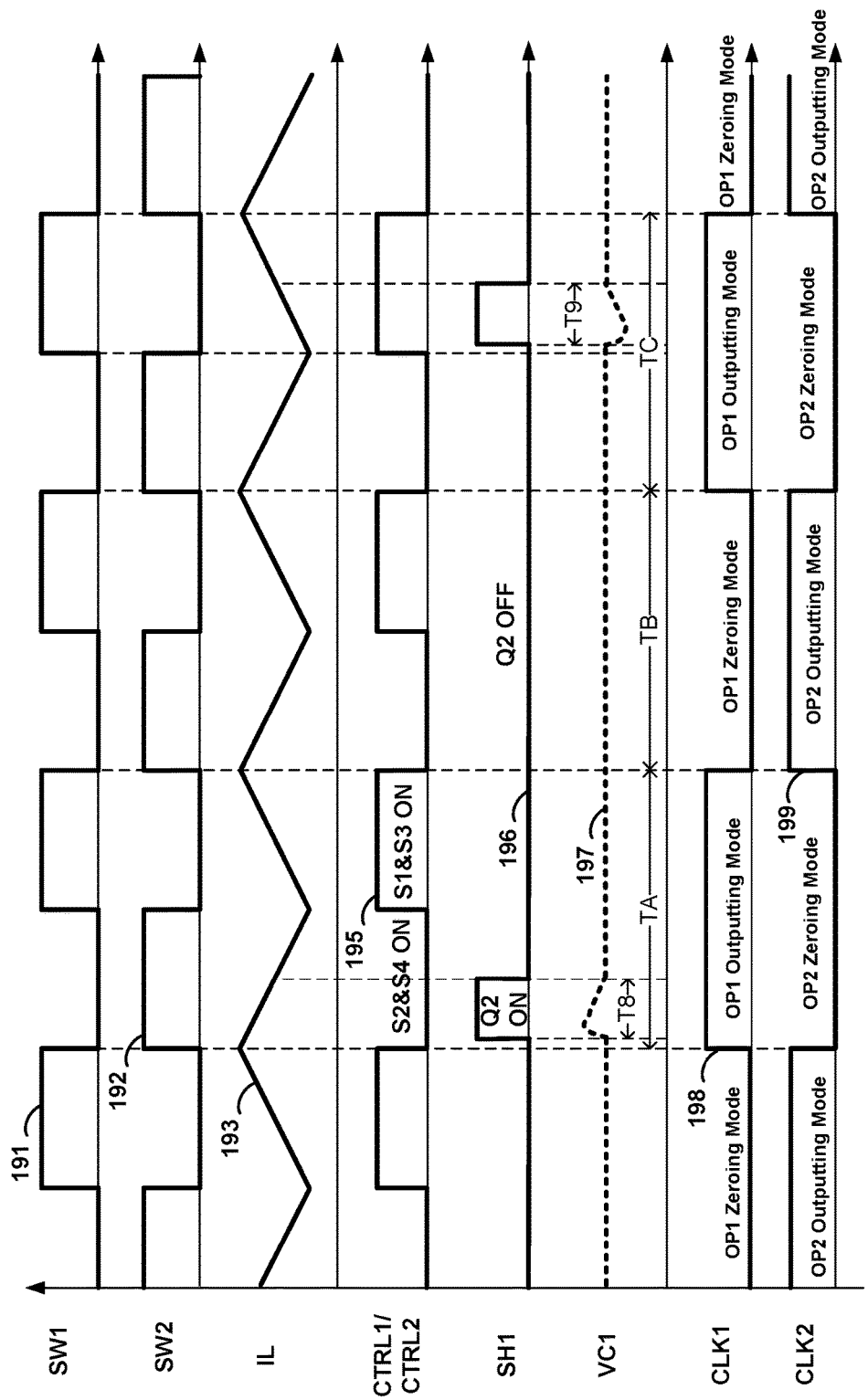
FIG. 8 shows a waveform diagram of signals of the buck-boost converter 300 in FIG. 5 working in a buck-boost mode in accordance with an embodiment of the present invention.

FIG. 8 shows a waveform diagram of signals of the buck-boost converter 300 in FIG. 5 working in a buck-boost mode in accordance with an embodiment of the present invention.

FIG. 8 shows the switch signal at the first switch node SW1 (plot 191), the switch signal at the second switch node SW2 (plot 192), the inductor current IL (plot 193), the buck control signal CTRL1 for the pair of buck switches (plot 195), the gate signal SH1 driving the transistor Q2 (plot 196), and the voltage VC1 on the capacitor C1 (plot 197), the first clock signal CLK1 for the first auto-zero amplifier OP3 (plot 198) and the second clock signal CLK2 for the second auto-zero amplifier OP4 (plot 199).

Referring to FIGS. 5 and 8, when the buck-boost converter 300 works in the buck-boost mode, when the first high side switch S1 and the second low side switch S3 are turned ON, the first low side switch S2 and the second high side switch S4 are turned OFF. When the first high side switch S1 and the second low side switch S3 are turned OFF, the first low side switch S2 and the second high side switch S4 are turned ON.

During the period of TA and TC, the first clock signal CLK1 is logic high, the second clock signal CLK2 is logic low, the first auto-zero amplifier OP3 is at the outputting mode, the second auto-aero amplifier OP4 is at the zeroing mode. During the period of TB, the first clock signal CLK1 is logic low, the second clock signal is logic high, the first auto-zero amplifier OP3 is at the zeroing mode, the second auto-zero amplifier OP4 is at the outputting mode. In the embodiment of the FIG. 8, the first clock signal CLK1 and the second clock signal CLK2 are complementary and have the duty cycle of 0.5.

During the period of T8, the control signal SH1 is logic high and the buck control signal CTRL1 is logic low, the first low side switch S2 and the first switch M1 is turned ON, the second switch M2 is turned OFF, the first auto-zero amplifier at the outputting mode is configured to detect the current I1 flowing through the first low side switch S2 and generate the detection current ISEN that represents the current I1. During the period of T8, the transistor Q2 is turned ON, the detection current ISEN flows the resistor R1 to generate a detection voltage signal that charges the capacitor C1 to sample the value of the detection current ISEN. Upon completion of period of T8, i.e. at the midpoint of the turn ON time of the first low side switch S2, the transistor Q2 is turned OFF, the average of the detection current ISEN is held as the charge stored in the capacitor C1. During the period of TB, the second auto-zero amplifier OP4 at the outputting mode is configured to generate the current sensing signal ICS that represents the output current in accordance with the charge on the capacitor C1.

During the period of T9, the control signal SH1 is logic high and the boost control signal CTRL2 is logic high, the second low side switch S3 and the third switch M3 is turned ON, the fourth switch M4 is turned OFF, the first auto-zero amplifier OP3 at the outputting mode is configured to detect the current I2 flowing through the second low side switch S3 to generate the detection current ISEN that represents the current I2. During the period of T9, the transistor Q2 is turned ON, the detection current ISEN flows through the resistor R1 to generate a detection voltage signal that charges the capacitor C1 to sample the value of the detection current ISEN. Upon completion of the period of T9, i.e. at the midpoint of the turn ON time of the second low side switch S3, the transistor Q2 is turned OFF, the average of the detection current ISEN is held as the charge stored in the capacitor C1. In the next cycle after the period of TC, the second auto-zero amplifier OP4 at the outputting mode is configured to generate the current sensing signal ICS that presents the input current in accordance with the charge stored on the capacitor C1.

Even though the periods TA, TB and TC are continuous and ordered in the embodiment of FIG. 8, however, in another embodiment, for example in the buck-boost mode, a current sensing circuit used for a buck-boost converter 300 may be configured to detect the average of the current I1 every fourth switching cycle during the first M1 switching cycles (M1 and generate the current sensing signal ICS that represents the output current IOUT. At the same time, the current sensing circuit may be configured to detect the average of the current I2 every fifth switching cycle during the sequential M2 switching cycles (M25) following the first M1 switching cycles and to generate the current sensing signal ICS that represents the input current IIN. In one embodiment, the sequence of the first M1 switching cycles for sensing the current I1 and the M2 switching cycles for sensing the current I2 can be changed. In a further embodiment, the current sensing circuit can average all the current sensing signal ICS during the first M1 switching cycles or during the subsequent M2 switching cycles, to improve at least one of accuracy and precision.

Obviously many modifications and variations of the present invention are possible in light of the above teachings. It is therefore to be understood that within the scope of the appended claims the invention may be practiced otherwise than as specifically described. It should be understood, of course, the foregoing disclosure relates only to a preferred embodiment (or embodiments) of the invention and that numerous modifications may be made therein without departing from the spirit and the scope of the invention as set forth in the appended claims. Various modifications are contemplated and they obviously will be resorted to by those skilled in the art without departing from the spirit and the scope of the invention as hereinafter defined by the appended claims as only a preferred embodiment(s) thereof has been disclosed.

What is claimed is:

1. A current sensing circuit used for a buck-boost converter, wherein the buck-boost converter comprises a first high side switch and a first low side switch which are couple in series between an input voltage and a ground and a second high side switch and a second low side switch which are coupled in series between an output voltage and the ground, the current sensing circuit comprising:

a first normally-ON transistor having a first terminal and a second terminal, wherein during a turn ON time of the first low side switch, the first terminal is coupled to the ground, and during a turn ON time of the second low side switch, the first terminal is coupled to a second switch node that is connected to a terminal of the second high side switch and a terminal of the second low side switch;

a second normally-ON transistor having a first terminal and a second terminal, wherein during the turn ON time of the first low side switch, the first terminal is coupled to a first switch node that is connected to a terminal of the first high side switch and a terminal of the first low side switch, and during the turn ON time of the second low side switch, the first terminal is coupled to the ground;

a first sensing circuit having a first input terminal coupled to the second terminal of the first normally-ON transistor, a second input terminal coupled to the second terminal of the second normally-ON transistor and an output terminal configured to provide a detection current; and a second sensing circuit detecting an average value of the detection current and providing a current sensing signal in accordance with the average value of the detection current, wherein during the turn ON time of the first low side switch, the detection current represents a current flowing though the first low side switch, the current sensing signal represents an output current of the buck-boost converter, and during the turn ON time of the second low side switch, the detection current represents a current flowing though the second low side switch, the current sensing signal represents an input current of the buck-boost converter.

2. The current sensing circuit of claim 1, further comprises a switch array comprising a first switch, a second switch, a third switch and a fourth switch, and wherein a first terminal of the first switch is coupled to the first switch node, a first terminal of the second switch and a first terminal of the fourth switch are coupled to the ground, a second terminal of the first switch and a second terminal of the second switch are coupled to the first terminal of the second normally-ON transistor, a first terminal of the third switch is coupled to the second switch node, a second terminal of the third switch and a second terminal of the fourth switch are coupled to the first terminal of the first normally-ON transistor.

3. The current sensing circuit of claim 2, wherein:

in a first state, the first low side switch is turned ON, the first and fourth switches are turned ON, the second and third switches are turned OFF;

in a second state, the second low side switch is turned ON, the first and fourth switches are turned OFF, the second and third switches are turned ON; and in a third state, the first and second low side switches are turned OFF, the first and third switches are turned OFF, the second and fourth switches are turned ON.

4. The current sensing circuit of claim 2, wherein the first sensing circuit comprises:

a first operational amplifier having a non-inversing terminal coupled to the second terminal of the first normally-ON transistor, an inversing terminal coupled to the second terminal of the second normally-ON transistor, and an output terminal; and a first transistor having a first terminal coupled to a supply voltage though a first resistor, a second terminal coupled to the inversing terminal of the first operational amplifier, and a control terminal coupled to the output terminal of the first operational amplifier.

5. The current sensing circuit of claim 2, wherein the first sensing circuit comprises:
 a first auto-zero amplifier having a non-inversing terminal coupled to the second terminal of the first normally-ON transistor, an inversing terminal coupled to the second terminal of the second normally-ON transistor, a clock input terminal configured to receive a first clock signal, and an output terminal; and
 a first transistor having a first terminal coupled to a supply voltage through a first resistor, a second terminal coupled to the inverting terminal of the first auto-zero amplifier, and a control terminal coupled to the output terminal of the first auto-zero amplifier.

6. The current sensing circuit of claim 5, wherein the second sensing circuit comprises:
 a second transistor having a first terminal coupled to the first terminal of the first transistor, a second terminal, and a control terminal configured to receive a first control signal;
 a second auto-zero amplifier having a non-inversing terminal coupled to the supply voltage through a second resistor and coupled to a first terminal of a capacitor, an inversing terminal coupled to the second terminal of the second transistor and coupled to a second terminal of the capacitor, a clock input terminal configured to receive a complementary signal of the first clock signal, and an output terminal; and
 a third transistor having a first terminal coupled to the non-inverting terminal of the second auto-zero amplifier, a second terminal coupled to ground through a third resistor, and a control terminal coupled to the output terminal of the second auto-zero amplifier.

7. The current sensing circuit of claim 2, wherein the second sensing circuit comprises:
 a second transistor having a first terminal coupled to the first terminal of the first transistor, a second terminal, and a control terminal configured to receive a first control signal;
 a second operational amplifier having a non-inversing terminal coupled to the supply voltage through a second resistor and coupled to a first terminal of a capacitor, an inversing terminal coupled to the second terminal of the second transistor and coupled to a second terminal of the capacitor, and an output terminal; and
 a third transistor having a first terminal coupled to the non-inverting terminal of the second operational amplifier, a second terminal coupled to the ground through a third resistor, and a control terminal coupled to the output terminal of the second operational amplifier.

8. The current sensing circuit of claim 1, wherein further comprises a bias current source coupled to one or more of the first input terminal and second input terminal of the first sensing circuit.

9. The current sensing circuit of claim 1, wherein further the first and second normally-ON transistors are matching and of a same type of transistor, each of the first and second low side switches has a larger size of the same type of transistor of the first and second normally-ON transistors.

10. An integrated circuit used for a buck-boost converter, comprising:
 a pair of buck switches comprising a first high side switch and a first low side switch which are coupled in series between an input voltage and a ground, wherein the pair of buck switches has a first switch node that is connected to a terminal of the first high side switch and a terminal of the first low side switch;
 a pair of boost switches comprising a second high side switch and a second low side switch which are coupled in series between an output voltage and the ground, the pair of boost switches has a second switch node that is connected to a terminal of the second high side switch and a terminal of the second low side switch;
 a first normally-ON transistor having a first terminal and a second terminal, wherein the first terminal is coupled to the ground during a turn ON time of the first low side switch and is coupled to the second switch node during a turn ON time of the second low side switch;
 a second normally-ON transistor having a first terminal and a second terminal, wherein the first terminal is coupled to the first switch node during the turn ON time of the first low side switch and is coupled to the ground during the turn ON time of the second low side switch;
 a first sensing circuit having a first input terminal coupled to the second terminal of the first normally-ON transistor, a second input terminal coupled to the second terminal of the second normally-ON transistor and an output terminal configured to provide a detection current;
 a second sensing circuit detecting an average value of the detection current and providing a current sensing signal in accordance with the average value of the detection current, wherein during the turn ON time of the first low side switch, the detection current represents a current flowing though the first low side switch, the current sensing signal represents an output current of the buck-boost converter, and during the turn ON time of the second low side switch, the detection current represents a current flowing though the second low side switch, the current sensing signal represents an input current of the buck-boost converter; and
 a driving circuit configured to provide a buck control signal for the pair of buck switches and a boost control signal for the pair of boost switches.

11. The integrated circuit of claim 10, further comprises a switch array comprising a first switch, a second switch, a third switch and a fourth switch, and wherein a first terminal of the first switch is coupled to the first switch node, a first terminal of the second switch and a first terminal of the fourth switch are coupled to the ground, a second terminal of the first switch and a second terminal of the second switch are coupled to the first terminal of the second normally-ON transistor, a first terminal of the third switch is coupled to the second switch node, a second terminal of the third switch and a second terminal of the fourth switch are coupled to the first terminal of the first normally-ON transistor.

12. The integrated circuit of claim 11, wherein:
 in a first state, the first low side switch is turned ON, the first and fourth switches are turned ON, the second and third switches are turned OFF;
 in a second state, the second low side switch is turned ON, the first and fourth switches are turned OFF, the second and third switches are turned ON; and
 in a third state, the first and second low side switches are turned OFF, the first and third switches are turned OFF, the second and fourth switches are turned ON.

13. The integrated circuit of claim 11, wherein the first sensing circuit comprises:
 a first operational amplifier having a non-inversing terminal coupled to the second terminal of the first normally-ON transistor, an inversing terminal coupled to the second terminal of the second normally-ON transistor, and an output terminal; and a first transistor having a first terminal coupled to a supply voltage though a first resistor, a second terminal coupled to the inversing terminal of the first operational amplifier, and a control terminal coupled to the output terminal of the first operational amplifier.

14. The current sensing circuit of claim 11, wherein the first sensing circuit comprises:
   a first auto-zero amplifier having a non-inversing terminal coupled to the second terminal of the first normally-ON transistor, an inversing terminal coupled to the second terminal of the second normally-ON transistor, a clock input terminal configured to receive a first clock signal, and an output terminal; and
   a first transistor having a first terminal coupled to a supply voltage through a first resistor, a second terminal coupled to the inverting terminal of the first auto-zero amplifier, and a control terminal coupled to the output terminal of the first auto-zero amplifier.

15. The integrated circuit of claim 14, wherein the second sensing circuit comprises:
   a second transistor having a first terminal coupled to the first terminal of the first transistor, a second terminal, and a control terminal configured to receive a first control signal;
   a second auto-zero amplifier having a non-inversing terminal coupled to the supply voltage through a second resistor and coupled to a first terminal of a capacitor, an inversing terminal coupled to the second terminal of the second transistor and coupled to a second terminal of the capacitor, a clock input terminal configured to receive a complementary signal of the first clock signal, and an output terminal; and
   a third transistor having a first terminal coupled to the non-inverting terminal of the second auto-zero amplifier, a second terminal coupled to ground through a third resistor, and a control terminal coupled to the output terminal of the second auto-zero amplifier.

16. The integrated circuit of claim 11, wherein the second sensing circuit comprises:
   a second transistor having a first terminal coupled to the first terminal of the first transistor, a second terminal, and a control terminal configured to receive a first control signal;
   a second operational amplifier having a non-inversing terminal coupled to the supply voltage through a second resistor and coupled to a first terminal of a capacitor, an inversing terminal coupled to the second terminal of the second transistor and coupled to a second terminal of the capacitor, and an output terminal; and
   a third transistor having a first terminal coupled to the non-inverting terminal of the second operational amplifier, a second terminal coupled to the ground through a third resistor, and a control terminal coupled to the output terminal of the second operational amplifier.

17. The integrated circuit of claim 10, wherein in a buck mode, the second high side switch is turned ON, the second low side switch is turned OFF, the first high side switch and the first low side switch are controller by the buck control signal with a first duty cycle D1, the input current IIN and the current sensing signal ICS satisfy an equation that: IIN=ICS*D1.

18. The integrated circuit of claim 10, wherein in a boost mode, the first high side switch is turned ON, the first low side switch is turned FF, the second high side switch and the second low side switch are controller by the boost control signal with a second duty cycle D2, the output current IOUT and the current sensing signal ICS satisfy an equation that: IOUT=ICS*(1−D2).

19. The integrated circuit of claim 10, wherein in a buck-boost mode, when the first high side switch and the second low side switch are turned ON, the first low side switch and the second high side switch are turned OFF, when the first high side switch and the second low side switch are turned OFF, the first low side switch and the second high side switch are turned ON.

* * * * *